(12) United States Patent
Hu

(10) Patent No.: US 11,895,796 B2
(45) Date of Patent: Feb. 6, 2024

(54) QUICK RELEASING DEVICE

(71) Applicant: PEGATRON CORPORATION, Taipei (TW)

(72) Inventor: Jie-Shiang Hu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 414 days.

(21) Appl. No.: 17/326,180

(22) Filed: May 20, 2021

(65) Prior Publication Data
US 2021/0392771 A1  Dec. 16, 2021

(30) Foreign Application Priority Data

Jun. 10, 2020 (TW) ................................ 109119562

(51) Int. Cl.
*H05K 7/14* (2006.01)
(52) U.S. Cl.
CPC ................................. *H05K 7/1411* (2013.01)
(58) Field of Classification Search
CPC ................................................... H05K 7/1411
See application file for complete search history.

(56) References Cited

U.S. PATENT DOCUMENTS

| | | | | |
|---|---|---|---|---|
| 9,788,454 B1 * | 10/2017 | Leung | | H05K 7/1411 |
| 10,317,949 B1 * | 6/2019 | Lin | | H05K 5/023 |
| 10,433,451 B1 * | 10/2019 | Wang | | H05K 7/1417 |
| 10,517,183 B1 * | 12/2019 | Huang | | H05K 7/1487 |
| 2012/0252238 A1 * | 10/2012 | Zhang | | H05K 7/1411 |
| | | | | 439/153 |
| 2013/0149028 A1 * | 6/2013 | Bollenbach | | H05K 7/1405 |
| | | | | 403/321 |
| 2015/0173217 A1 * | 6/2015 | Mao | | H05K 7/1411 |
| | | | | 312/332.1 |
| 2016/0073537 A1 * | 3/2016 | Tseng | | G06F 1/183 |
| | | | | 361/809 |
| 2016/0219745 A1 * | 7/2016 | Loparco | | H05K 7/1492 |
| 2017/0079156 A1 * | 3/2017 | Hsiao | | H05K 7/1488 |
| 2019/0199024 A1 * | 6/2019 | Wang | | H01R 12/7058 |
| 2020/0112774 A1 * | 4/2020 | Lee | | H04Q 1/025 |
| 2021/0050693 A1 * | 2/2021 | Hung | | H05K 7/1411 |

(Continued)

FOREIGN PATENT DOCUMENTS

CN    2509628    9/2002
TW    M516291   1/2016

(Continued)

*Primary Examiner* — Daniel J Rohrhoff
(74) *Attorney, Agent, or Firm* — J.C. PATENTS

(57) ABSTRACT

A quick releasing device, which is adapted to be fixed in or removed from a slot of a casing, is provided. The quick releasing device includes a frame, an arm and a handle. The frame has a hole. The arm is disposed at one side of the frame and a part of the arm corresponds to the hole. The handle is rotatably disposed at another side of the frame to rotate between a working position and a retracting position. The handle includes a pressing member whose position corresponds to the hole. The pressing member of the handle passes through the hole of the frame and pushes the arm when the quick releasing device is inserted into the slot of the casing and the handle is rotated from the working position to the retracting position, deforming the arm and interfering with a wall surface of the casing beside the slot.

9 Claims, 5 Drawing Sheets

(56) References Cited

U.S. PATENT DOCUMENTS

| | | | | |
|---|---|---|---|---|
| 2021/0153371 A1* | 5/2021 | Liu | ................... | H05K 7/1488 |
| 2021/0274667 A1* | 9/2021 | Lin | ................... | H05K 7/1411 |
| 2023/0024568 A1* | 1/2023 | Chen | ................... | H05K 5/023 |
| 2023/0144465 A1* | 5/2023 | Chia | ................... | H05K 7/1409 |
| | | | | 312/223.2 |

FOREIGN PATENT DOCUMENTS

| | | |
|---|---|---|
| TW | I523007 | 2/2016 |
| TW | M517501 | 2/2016 |

\* cited by examiner

QUICK RELEASING DEVICE

CROSS-REFERENCE TO RELATED APPLICATION

This application claims the priority benefit of Taiwan application serial no. 109119562, filed on Jun. 10, 2020. The entirety of the above-mentioned patent application is hereby incorporated by reference herein and made a part of this specification.

BACKGROUND

Technology Field

This disclosure relates to a quick releasing device, and in particular to a quick releasing device that can be disassembled and assembled without tools.

Description of Related Art

Conventional disassembly structures are mostly locked and fixed in place with screws. As the dismantling is done one by one using tools, the process is tedious and time-consuming, causing inconvenience to the user. Therefore, how to disassemble quickly and conveniently remains a challenge for those skilled in the art.

SUMMARY

This disclosure provides a quick releasing device, which can be disassembled without tools.

A quick releasing device of the disclosure is adapted to be fixed in a slot of a casing or removed from the slot. The quick releasing device includes a frame, an arm and a handle. The frame has a hole. The arm is disposed at one side of the frame and a part of the arm corresponds to the hole. The handle is rotatably disposed at another side of the frame, so as to rotate between a working position and a retracting position. The handle includes a pressing member whose position corresponds to the hole. The pressing member of the handle passes through the hole of the frame and pushes the arm when the quick releasing device is inserted into the slot of the casing and the handle is rotated from the working position to the retracting position, so as to deform the arm and interfere with a wall surface of the casing beside the slot.

In an embodiment of the disclosure, the arm includes a buffering section that does not overlap the hole and a movable section that overlaps the hole, and a part of the buffering section is fixed to the frame.

In an embodiment of the disclosure, the buffering section includes a first segment, a second segment, and a third segment connected in a bent manner. The first segment is fixed to the frame and the third segment is connected to the movable section.

In an embodiment of the disclosure, the first segment, the second segment, and the third segment form a U shape.

In an embodiment of the disclosure, the movable section includes a fourth segment and a fifth segment that are connected in a bent manner. The fourth segment and the hole have an oblique overlap. The fifth segment does not go beyond an outer edge of the buffering section when the handle is in the working position. The pressing member pushes the fourth segment to drive the fifth segment to go beyond the outer edge of the buffering section when the pressing member of the handle passes through the hole of the frame.

In an embodiment of the disclosure, the fourth segment and the fifth segment form a V shape.

In an embodiment of the disclosure, the quick releasing device further includes a side fixing member that is located on a lateral edge of the frame and fixed to at least one of the frame and the arm, and the handle is pivoted on the side fixing member.

In an embodiment of the disclosure, the side fixing member includes a connecting segment that is attached to the frame, a pivot segment disposed uprightly on an outer side of the frame and pivoted on the handle, and a fixed segment extending to an inner side of the frame and fixed to the arm.

In an embodiment of the disclosure, the pressing member is a hook.

In an embodiment of the disclosure, the frame is a power supply bracket or a hard disk bracket.

Based on the above, the quick releasing device of the disclosure disposes the arm on the inner side of the frame and the part of the arm corresponds to the hole of the frame. The handle is rotatably disposed at the outer side of the frame. The pressing member of the handle passes through the hole of the frame and pushes the arm when the quick releasing device is inserted into the slot of the casing and the handle is rotated from the working position to the retracting position, deforming the arm and interfering with the wall surface of the casing beside the slot. Therefore, the quick releasing device of the disclosure may complete the engagement when the handle is retracted, which prevents the quick releasing device from being withdrawn from the casing. The handle is rotated to the working position when the quick releasing device is to be withdrawn from the casing, enabling the arm to return to its original position and stop interfering with the wall surface of the casing beside the slot. Therefore, the quick releasing device may be removed from the casing.

To make the abovementioned more comprehensible, several embodiments accompanied by drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the descriptions, serve to explain the principles of the disclosure.

DETAILED DESCRIPTION OF THE EMBODIMENTS

Figure 1:
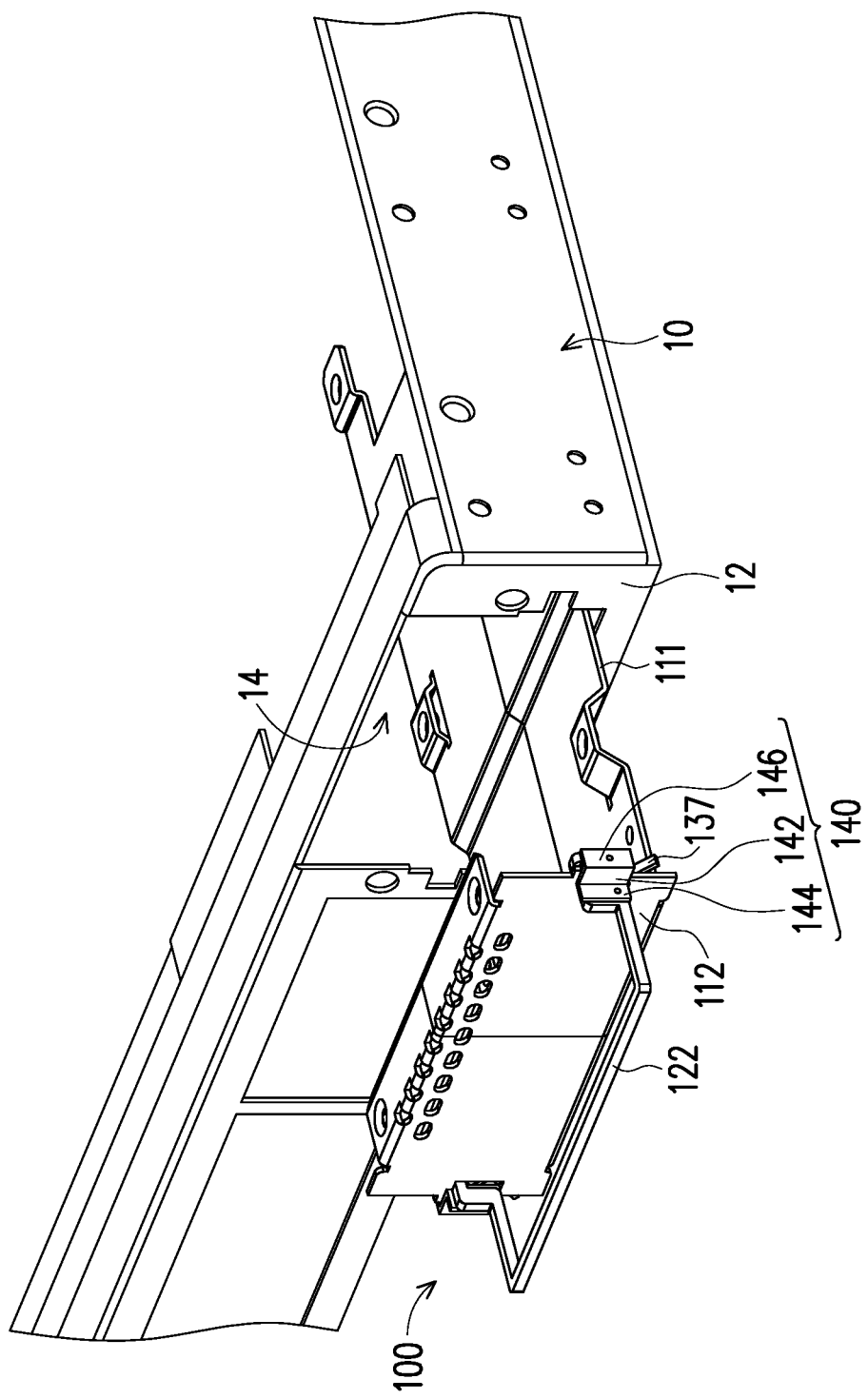
FIG. 1 is a schematic diagram of a quick releasing device that has not been pushed into a casing according to an embodiment of the disclosure.
Figure 2:
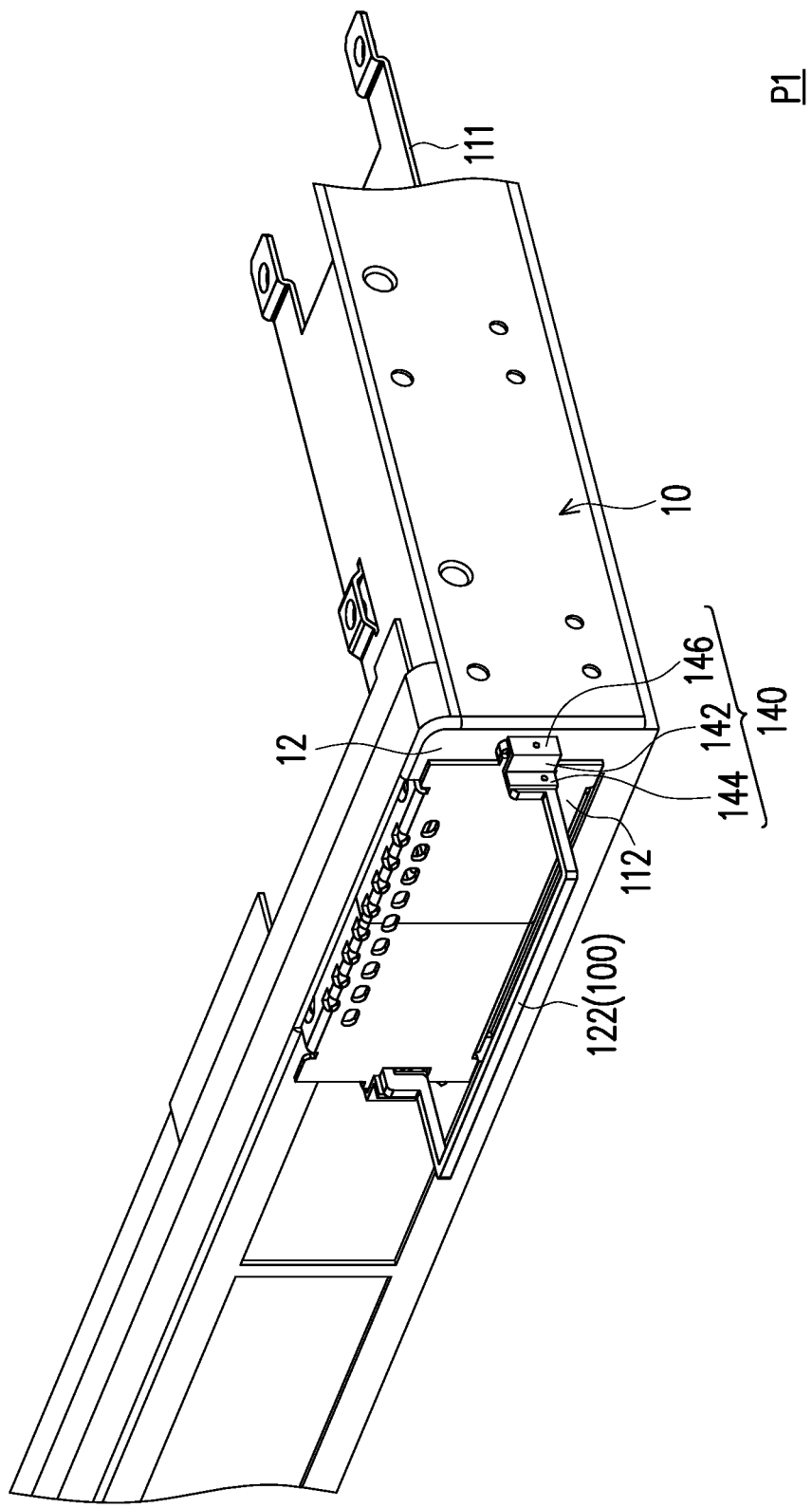
FIG. 2 is a schematic diagram of the quick releasing device in FIG. 1 when the quick releasing device is pushed into the casing and a handle is in a working position.
Figure 3:
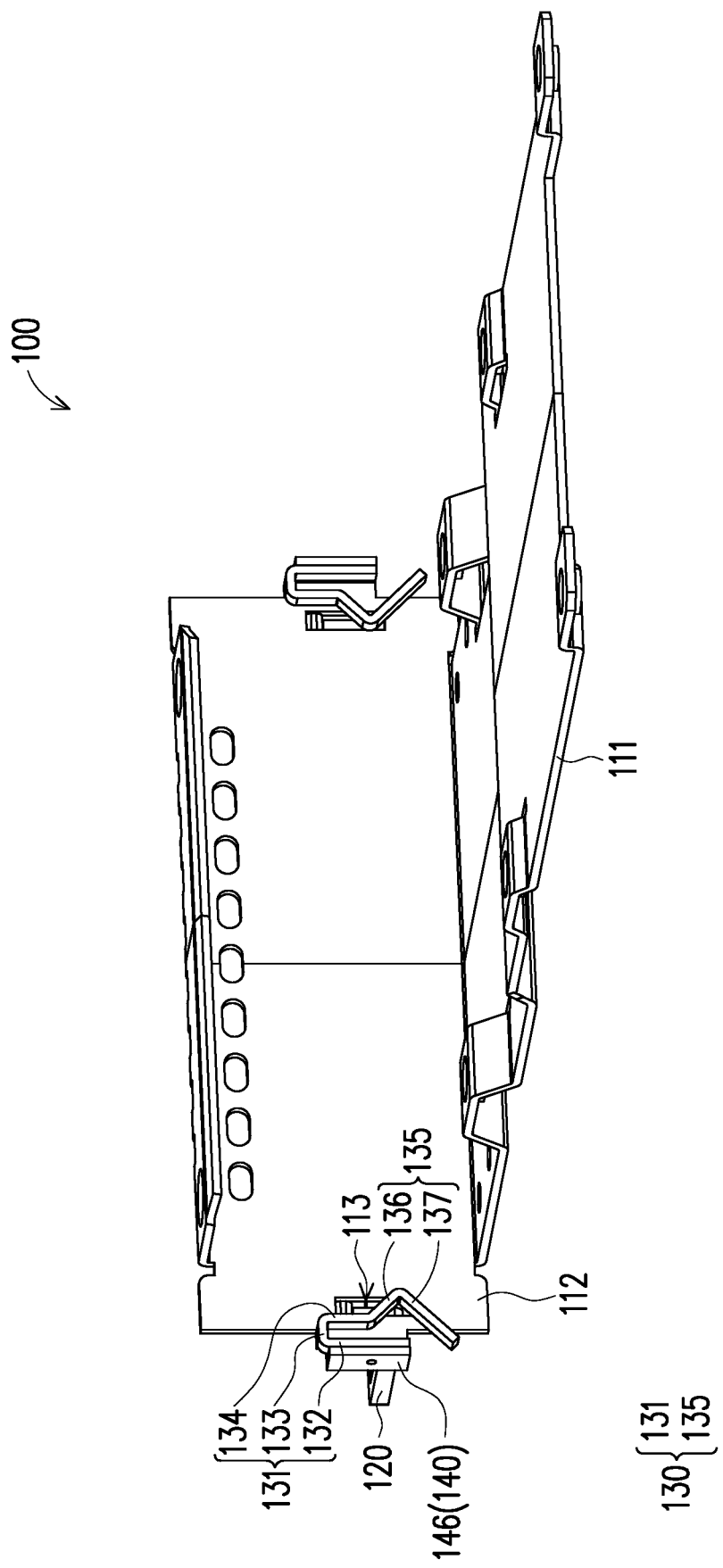
FIG. 3 is a schematic diagram of the quick releasing device in FIG. 2 from another perspective.
Figure 4:
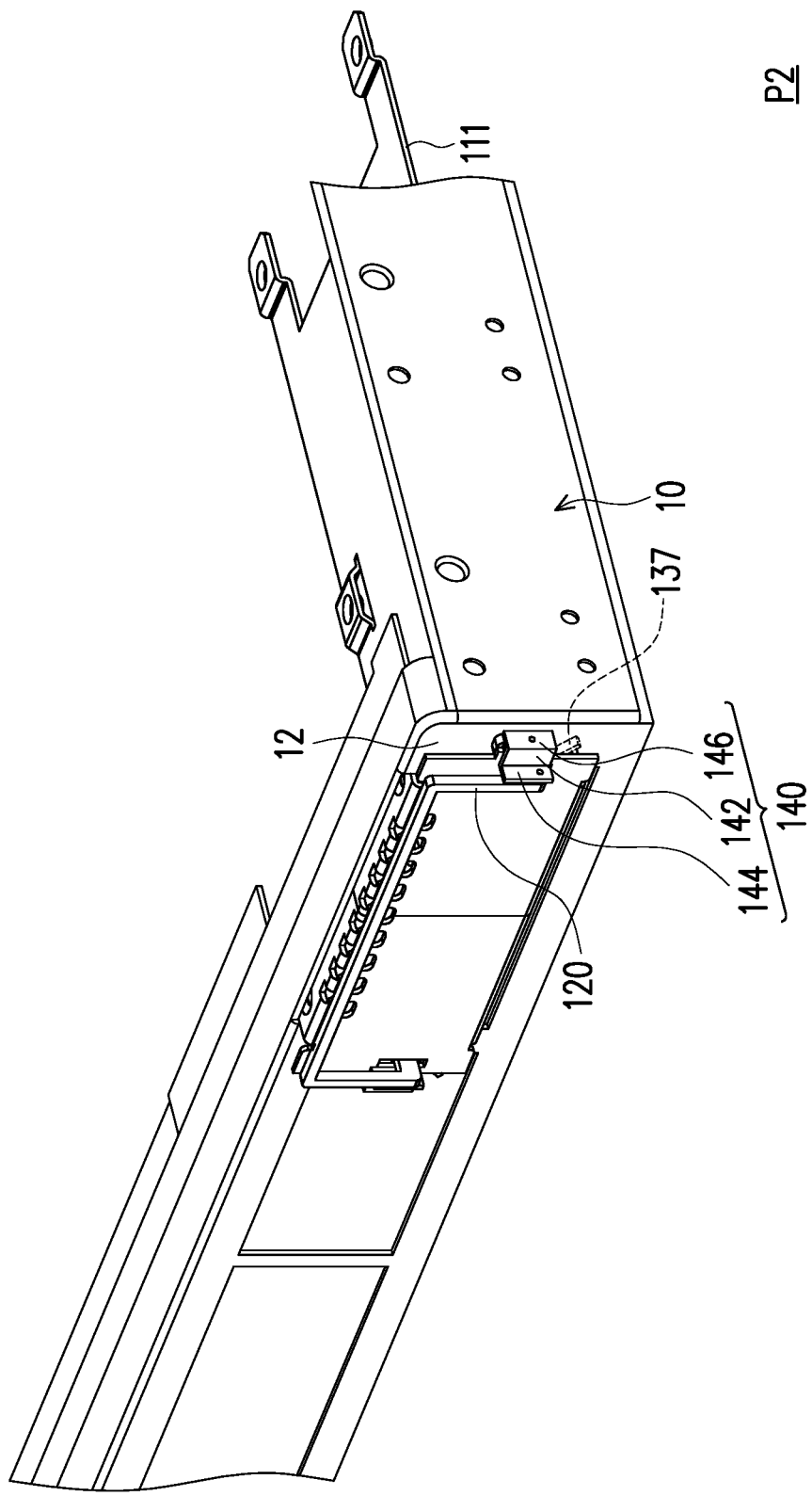
FIG. 4 is a schematic diagram of the quick releasing device in FIG. 1 when the quick releasing device is pushed into the casing and the handle is in a retracting position.
Figure 5:
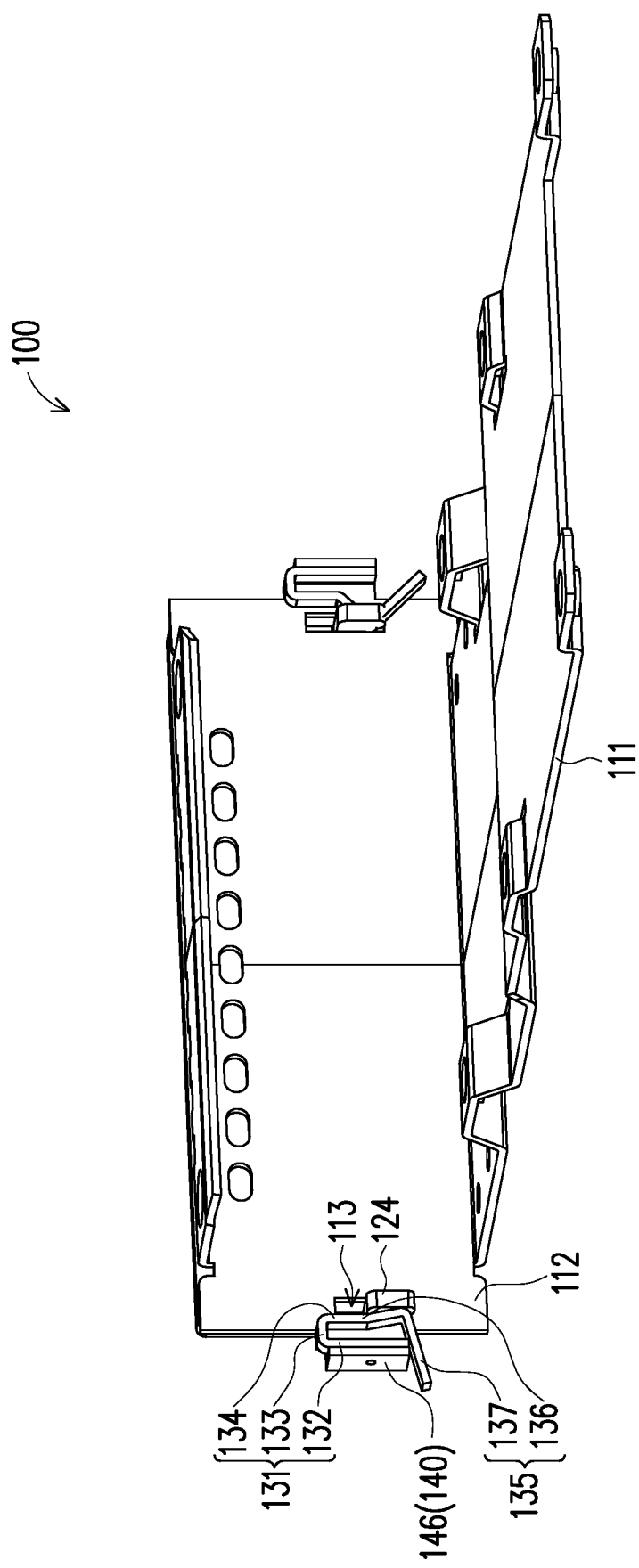
FIG. 5 is a schematic diagram of the quick releasing device in FIG. 4 from another perspective.

FIG. 1 is a schematic diagram of a quick releasing device that has not been pushed into a casing according to an embodiment of the disclosure. FIG. 2 is a schematic diagram of the quick releasing device in FIG. 1 when the quick releasing device is pushed into the casing and a handle is in a working position. FIG. 3 is a schematic diagram of the quick releasing device in FIG. 2 from another perspective. FIG. 4 is a schematic diagram of the quick releasing device in FIG. 1 when the quick releasing device is pushed into the casing and the handle is in a retracting position. FIG. 5 is a schematic diagram of the quick releasing device in FIG. 4 from another perspective. It should be noted that in FIGS. 1, 2, and 4, in order to show where a quick releasing device 100 is located within a casing 10, only a side surface of the casing 10 (such as a side wall 12) is simply shown while a top surface of the casing 10 is not shown.

With reference to FIGS. 1 to 5, the quick releasing device 100 of the embodiment is adapted to be fixed in a slot 14 of the casing 10 or removed from the slot 14. The quick releasing device 100 includes a frame 112, an arm 130 (FIG. 3), and a handle 120. In the embodiment, the casing 10 is, for example, a casing of a server. The frame 112 includes a bottom plate 111, and the bottom plate 111 may be configured to hold a power supply (not shown) or a hard disk (not shown), which enables the frame 112 to serve as a power supply bracket or a hard disk bracket. In other words, the quick releasing device 100, in cooperation with the power supply or the hard disk, may serve as a pluggable power supply or an expansion device such as a hard disk, but the type of the casing 10 and the quick releasing device 100 are not limited thereto.

As shown in FIG. 3, the frame 112 has a hole 113 near an edge. The arm 130 is disposed at an inner side the frame 112 and a position of a part of the arm corresponds to the hole 113. In the embodiment, the arm 130 includes a buffering section 131 that does not overlap the hole 113 and a movable section 135 that overlaps the hole 113.

A part of the buffering section 131 is fixed to the frame 112. In detail, the buffering section 131 includes a first segment 132, a second segment 133, and a third segment 134 that are connected in a bent manner. The first segment 132 is fixed to the frame 112, and the second segment 133 and the third segment 134 are not fixed to the frame 112 and may be deformed. In the embodiment, the first segment 132 and the frame 112 may be integrated in one piece. That is, the first segment 132 extends straight from the frame 112 and has better strength. In other embodiments, the first segment 132 may also be locked and fixed in place, or welded to the frame 112.

In addition, in the embodiment, the first segment 132, the second segment 133, and the third segment 134 form a U shape. Such a design enables the third segment 134 to deform toward an internal space (that is, the third segment 134 may deform toward the first segment 132) of the U-shaped configuration. In other words, the U-shaped design may provide space for the third segment 134 to deform. In other embodiments, the buffering section 131 may also be V-shaped or S-shaped as long as it has a shape that allows the third segment 134 to face the first segment 132, and the shape is not limited by the figure.

In addition, in the embodiment, the movable section 135 includes a fourth segment 136 and a fifth segment 137 that connected in a bent manner, and the third segment 134 of the buffering section 131 is connected to the fourth segment 136 of the movable section 135. In the embodiment, the fourth segment 136 and the fifth segment 137 form a V shape whose opening faces the first segment 132 (that is, toward the left of FIG. 3). The fourth segment 136 and the hole 113 have an oblique overlap, and the fifth segment 137 is located below the first segment 132, the second segment 133, the third segment 134, and the fourth segment 136.

With reference to FIGS. 2 and 4 concurrently, in the embodiment, the handle 120 is rotatably disposed on an outer side of the frame 112 so as to rotate between a working position P1 (FIG. 2) and a retracting position P2 (FIG. 4). A user may pull or push the handle 120 to withdraw or insert the quick releasing device 100 into the slot 14 of the casing 10 when the handle 120 is located at the working position P1. The handle 120 is close to the frame 112 when the handle 120 is located at the retracting position P2, which prevents it from being too protruding, so as to free up more space.

As shown in FIG. 2, in the embodiment, the quick releasing device 100 further includes a side fixing member 140, which is located on a lateral edge of the frame 112 and fixed to at least one of the frame 112 and the arm 130, and the handle 120 is pivoted on the side fixing member 140. In detail, the side fixing member 140 includes a connecting segment 142 attached to the frame 112, a pivot segment 144 disposed uprightly on the outer side of the frame 112 and pivoted on the handle 120, and a fixed segment 146 extending from the connecting segment 142 to the inner side of the frame 112 and fixed to the arm 130. The pivot segment 144, the connecting segment 142, and the fixed segment 146 are sequentially connected in a Z-shape with a rotation angle of 90 degrees. The form of the side fixing member 140 is not limited thereto.

In the embodiment, the fixed segment 146 of the side fixing member 140 is screwed into the first segment 132 of the arm 130, and the first segment 132 of the arm 130 and the frame 112 are integrated as one piece. Therefore, the arm 130 may be fixed to the frame 112 through the side fixing member 140. In addition, the handle 120 is pivoted on the pivot segment 144 of the side fixing member 140, and is rotatably disposed on the outer side of the frame 112. In other embodiments, the handle 120 may also be directly pivoted on the frame 112, and the side fixing member 140 may be omitted.

It is worth mentioning that in the embodiment, the quick releasing device 100 may also be fixed to the casing 10 when the handle 120 is switched from the working position P1 to the retracting position P2, in addition to freeing up an outer space of the quick releasing device 100. In detail, as shown in FIG. 5, in the embodiment, the handle 120 includes a pressing member 124 and a position of the pressing member 124 corresponds to the hole 113. In the embodiment, the pressing member 124 is a hook, but the type of the pressing member 124 is not limited thereto.

With reference to FIGS. 2 and 3, the pressing member 124 is still located at the outer side of the frame 112 and has not inserted into the hole 113 of the frame 112 when the handle 120 (FIG. 2) is located at the working position P1. At this time, the arm 130 is in an initial state, and the fifth segment 137 (FIG. 3) does not go beyond an outer edge of the buffering section 131 (a left edge of the buffering section 131 in FIG. 3).

With reference to FIG. 4, when the quick releasing device 100 is inserted into the slot 14 of the casing 10 and the handle 120 is rotated from the working position P1 to the retracting position P2, it can be clearly seen from FIG. 5 that the pressing member 124 of the handle 120 passes through the hole 113 of the frame 112 and then goes down to push the fourth segment 136 of the arm 130. The inclined fourth segment 136 of the arm 130 deforms and moves leftwards during the process of being pushed, which drives the fifth segment 137 of the arm 130 to move leftwards and goes beyond the outer edge (left edge) of the buffering section 131, and interferes with a wall surface of the casing 10 next to the slot 14 in FIG. 4. At this time, the quick releasing device 100 cannot be withdrawn from the casing 10.

In other words, the quick releasing device 100 of the embodiment completes its engagement when the handle 120 is rotated to the retracting position P2 and is locked to the casing 10. To release the engagement of the quick releasing device 100, it can be done by simply rotating the handle 120 back to the working position P1. In this situation, the fourth segment 136 of the arm 130 may not be pressed, and the fifth segment 137 may correspondingly return to its original position instead of interfering with the wall surface of the casing 10 next to the slot 14. Therefore, the quick releasing device 100 of the embodiment is quite simple and convenient to operate, and may be fixed to or removed from the casing 10 without using any tool under the premise of decreasing occupied space, which greatly reduces the man-hours and labor costs in fixing and removal.

In summary, the quick releasing device of the disclosure disposes the arm on the inner side of the frame and a part of the arm corresponds to the hole of the frame. The handle is rotatably disposed on the outer side of the frame. The pressing member of the handle passes through the hole of the frame and pushes the arm when the quick releasing device is inserted into the slot of the casing and the handle is rotated from the working position to the retracting position, so as to deform the arm and interfere with the wall surface of the casing beside the slot. Therefore, the quick releasing device of the disclosure may complete the engagement when the handle is retracted, which prevents the quick releasing device from being withdrawn from the casing. The handle is rotated to the working position when the quick releasing device is to be withdrawn from the casing, enabling the arm to return to its original position and stop interfering with the wall surface of the casing beside the slot. Therefore, the quick releasing device may be removed from the casing.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A quick releasing device, adapted to be fixed in a slot of a casing or removed from the slot, comprising:
    a frame, comprising a hole;
    an arm, disposed on one side of the frame and a position of a part of the arm corresponds to the hole; and
    a handle, rotatably disposed on another side of the frame, so as to rotate between a working position and a retracting position, wherein the handle comprises a pressing member whose position corresponds to the hole, and when the quick releasing device is inserted into the slot of the casing and the handle is rotated from the working position to the retracting position the pressing member of the handle passes through the hole of the frame and pushes the arm so as to deform the arm and interfere with a wall surface of the casing beside the slot,
    wherein the arm comprises a buffering section that does not overlap the hole and a movable section that overlaps the hole and a part of the buffering section is fixed to the frame.

2. The quick releasing device according to claim 1, wherein the buffering section comprises a first segment, a second segment, and a third segment connected in a bent manner, the first segment is fixed to the frame, and the third segment is connected to the movable section.

3. The quick releasing device according to claim 2, wherein the first segment, the second segment, and the third segment form a U shape.

4. The quick releasing device according to claim 3, wherein the fourth segment and the fifth segment form a V shape.

5. The quick releasing device according to claim 1, wherein the movable section comprises a fourth segment and a fifth segment that are connected in a bent manner, the fourth segment and the hole have an oblique overlap, the fifth segment does not go beyond an outer edge of the buffering section when the handle is at the working position and the pressing member pushes the fourth segment to drive the fifth segment to go beyond the outer edge of the buffering section when the pressing member of the handle passes through the hole of the frame.

6. The quick releasing device according to claim 1, further comprising:
    a side fixing member, located on a lateral edge of the frame and fixed to at least one of the frame and the arm and the handle is pivoted on the side fixing member.

7. The quick releasing device according to claim 6, wherein the side fixing member comprises a connecting segment that is attached to the frame, a pivot segment disposed uprightly on an outer side of the frame and pivoted on the handle, and a fixed segment extending to an inner side of the frame and fixed to the arm.

8. The quick releasing device according to claim 1, wherein the pressing member is a hook.

9. The quick releasing device according to claim 1, wherein the frame is a power supply bracket or a hard disk bracket.

* * * * *